United States Patent [19]

Wada

[11] Patent Number: 5,275,521
[45] Date of Patent: Jan. 4, 1994

[54] WAFER TRANSFER DEVICE

[75] Inventor: Athushi Wada, Tokyo, Japan

[73] Assignee: Tokyo Electron Sagami Limited, Kanagawa, Japan

[21] Appl. No.: 907,545

[22] Filed: Jul. 2, 1992

[30] Foreign Application Priority Data

| Jul. 3, 1991 | [JP] | Japan | 3-188339 |
| Jul. 3, 1991 | [JP] | Japan | 3-188340 |
| Jul. 3, 1991 | [JP] | Japan | 3-188341 |

[51] Int. Cl.$^5$ .................................................. B65G 65/00
[52] U.S. Cl. ...................................... 414/406; 414/331; 414/416; 414/937
[58] Field of Search ............... 414/404, 416, 417, 331, 414/172, 156, DIG.

[56] References Cited

U.S. PATENT DOCUMENTS

| 4,770,590 | 9/1988 | Hugues et al. | 414/172 |
| 4,775,281 | 10/1988 | Prentakis | 414/331 X |
| 4,985,722 | 1/1991 | Ushijima et al. | 414/416 X |
| 5,022,695 | 6/1991 | Ayers | 414/416 X |
| 5,054,988 | 10/1991 | Shiraiwa | 414/417 X |
| 5,110,248 | 5/1992 | Asano et al. | 414/416 X |
| 5,125,784 | 6/1992 | Asano | 414/417 X |
| 5,162,047 | 11/1992 | Wada et al. | 414/416 X |

Primary Examiner—David A. Bucci
Attorney, Agent, or Firm—Oblon, Spivak, McClelland, Maier & Neustadt

[57] ABSTRACT

A wafer transfer device is intended to transfer wafers between a wafer boat in which a plurality of wafer support plates are vertically arranged at regular intervals and a cassette in which a plurality of wafer-mounted levels are vertically arranged at regular intervals. Each of the wafer support plates is ring-shaped having an opening in the center thereof and a passage is defined by openings of the wafer support plates, extending vertically in the boat. The wafer is horizontally transferred into and out of the wafer boat between the wafer support plates by a fork. The fork can be moved in vertical and horizontal directions and it can also be swung. A wafer push-up disk is arranged movable up and down through the passage in the boat. Three wafer supports are projected from the top of the push-up disk. These projections on the push-up disk are arranged contactable with the underside of the wafer without interfering with the fork. The fork and the push-up disk are associated with each other by a controller to achieve the transferring of wafers.

15 Claims, 12 Drawing Sheets

WAFER TRANSFER DEVICE

BACKGROUND OF THE INVENTION

1. Field of the Invention

The present invention relates to a wafer transfer device and more particularly, a device for transferring wafers between wafer boat and cassette.

2. Description of the Related Art

A wafer housing case which is called carrier or cassette is usually used to transfer semiconductor wafers and others in the course of manufacturing semiconductor devices.

The wafer cassette is made of resin, for example, light in weight and low in cost, and it is designed to house plural or 25 sheets of wafers therein.

When a plurality of wafers are to be processed as a batch by the heat process system, they cannot be heat-processed under the condition that they are kept housed in the resin-made cassette. It is therefore usually needed that they are heat-processed after they are transferred into the heat processing wafer boat made of quartz, for example, chemically stable and excellent in heat resistance.

Figure 1:
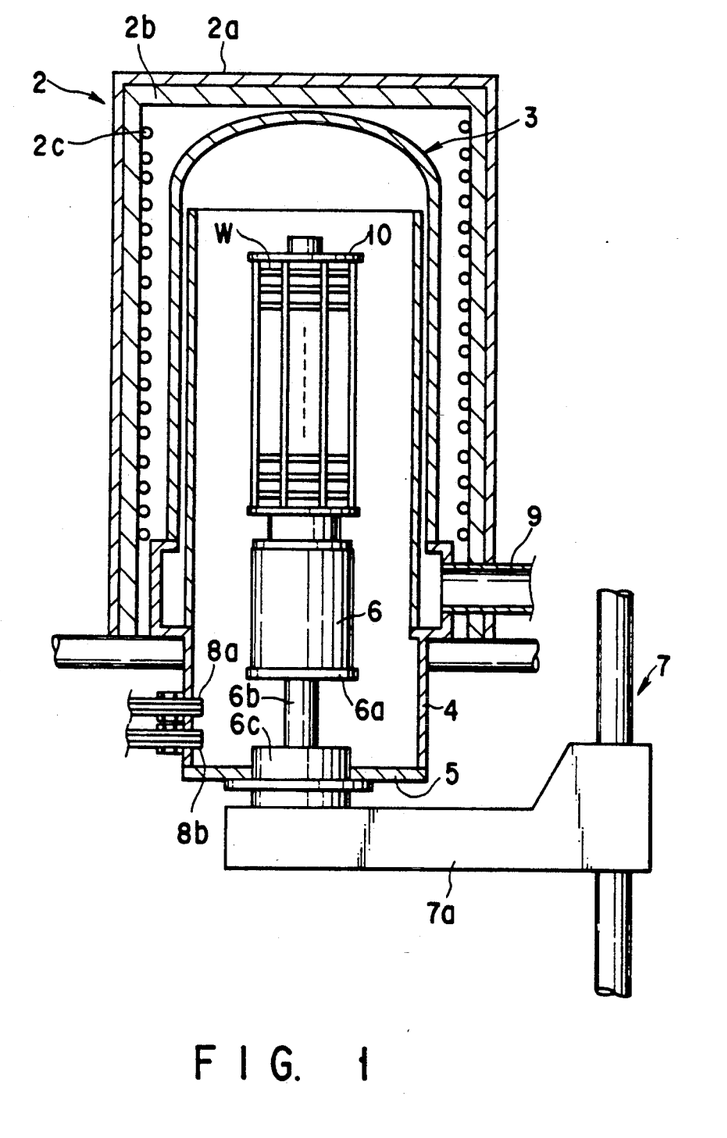
FIG. 1 is a sectional view showing a wafer boat loaded in a pressure-reduced CVD system of the vertical type which is an example of a heat process system.
Figure 2:
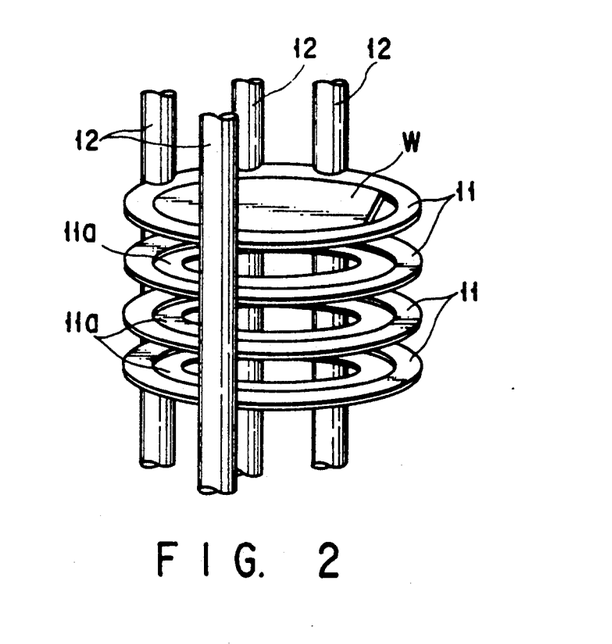
FIG. 2 is a perspective view showing a part of the wafer boat enlarged.

As shown in FIGS. 1 and 2, a plurality wafer-mounted levels are vertically arranged in a wafer boat 10 so as to process a plurality of wafers as a batch. A ring-shaped support plate 11 having a recessed support face 11a thereon (see FIG. 2) has been used these days as the wafer-mounted level, because the circumferential portion of the wafer can be surrounded by the ring-shaped support plate 11. When the wafer is supported in this manner, its temperature can be uniformly lowered and raised so as to form a film of uniform thickness on the wafer.

When the wafer is transferred between the ring-shaped support plate and a transfer fork, however, the up- and down-movement of the fork is disturbed by the ring-shaped support plate. This makes it necessary to move the wafer up and down independently of the fork. To meet this need, an inventor of the present invention has provided in U.S. patent application 07/572,005 (now U.S. Pat. No. 5,162,047 issued Nov. 10, 1992) double fork structure in which two wafer transferring and pushing-up forks are used.

When this double fork structure is employed, however, intervals between the wafer-mounted levels or ring-shaped support plates 11 must be made large to insert it.

SUMMARY OF THE INVENTION

The object of the present invention is therefore to provide a wafer transfer device capable of making smaller the intervals between ring-shaped wafer support plates in the heat processing wafer boat.

According to the present invention, there can be provided a wafer transfer device for transferring wafers into and out of a wafer boat in which a plurality of wafer support plates are vertically arranged having intervals between them, the ring-shaped wafer support plates being ring-shaped and defining a vertically-extending passage by center openings thereof, said wafer transfer device comprising: carrying means for horizontally carrying the wafer into and out of the wafer boat between the wafer support plates; a wafer push-up disk arranged movable up and down through the passage; wafer support means projected from the top of the push-up disk and arranged contactable with the underside of the wafer without interfering with the carrying means; drive means for driving the push-up disk up and down; and means for controlling the carrying means and the push-up disk such that they can be associated with each other.

According to the present invention, the underside of the wafer is released from the ring-shaped wafer support plate in the wafer boat by the push-up mechanism. This enables a gap, into which the carrying means is inserted, to be provided between the under-side of the wafer and the support plate. Further, the push-up mechanism is arranged movable up and down through the passage defined by center openings of the support plates. This makes it unnecessary to insert the wafer-lifting means into the wafer boat between the support plates. The intervals between the support plates in the boat can be thus made smaller.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims. dr

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

FIG. 1 is a sectional view showing a wafer boat 10 loaded in the pressure-reduced CVD system of a vertical type which is an example of the heat process system. A heating furnace 1 includes an outer shell made of a metal plate 2a and a heat insulating layer 2b, and a heater 2c arranged along the inner wall of the outer shell. A cylindrical reactor tube 3 is erected in the heating furnace 2. A manifold 4 made of stainless steel, for example, is connected to the lower end of the reactor tube 3. Gas supply pipes 8a and 8b through which film forming gases are introduced into the reactor tube 3 are connected to the manifold 4. An exhaust pipe 9 through which gases are exhausted outside after the reaction is also connected to the manifold 4.

The wafer boat 10 is supported on a heat insulating sleeve 6 such that its lower end portion is inserted into the sleeve 6. The heat insulating sleeve 6 is on a turntable 6a. A rotating shaft 6b of the turntable 6a is connected to a drive mechanism in a support 7a of a lifter unit 7. A cap 5 is attached to a base 6c of the rotating shaft 6b. When the lifter unit 7 is moved up and down, the open bottom of the manifold 4 is closed and opened by the cap 5.

FIG. 2 is a perspective view showing a part of the wafer boat 10 enlarged. The wafer boat 10 comprises four columns 12 and plural or 60 sheets of ring-shaped wafer support plates 11. Each of the support plates 11 has a wafer support face 11a which is so recessed as to keep the top surface of the wafer aligned with that of the wafer support plate 11 when the wafer is supported on the wafer support plate 11.

The wafer boat 10 which is intended to hold the 6-inch wafers therein has the following dimensions:

The outer diameter of each ring-shaped wafer support plate: $\phi$156 mm, the inner diameter of each ring-shaped wafer support plate: $\phi$123 mm, the outer diameter of the wafer support face: $\phi$153 mm, the thickness of each ring-shaped wafer support plate: 3 mm (however, that of the wafer support face: 2 mm), and the intervals between the adjacent ring-shaped wafer support plates: 9.525 mm.

Figure 3:
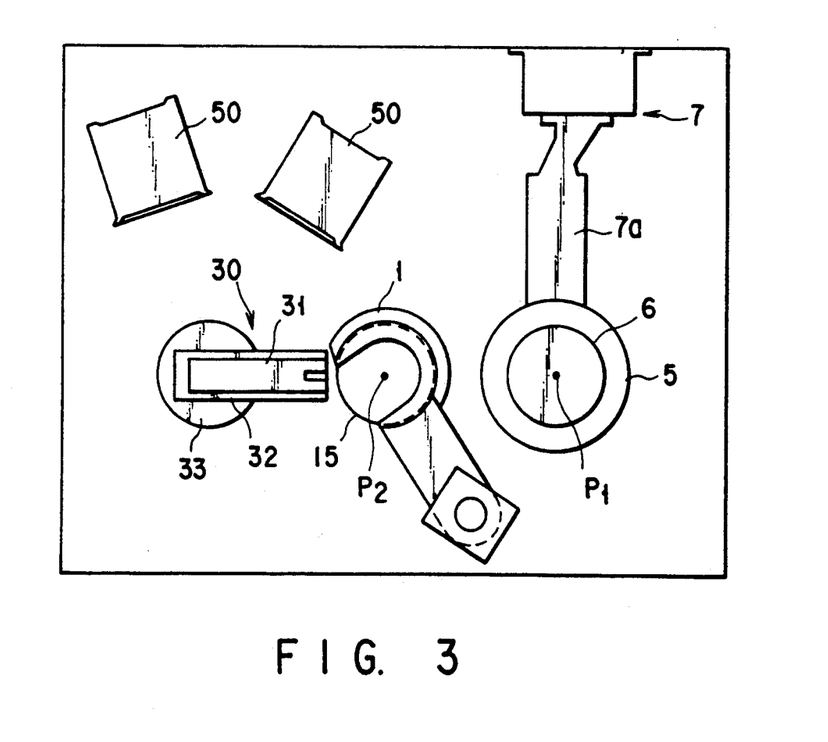
FIG. 3 is a plan view showing how each member of the heat process system is positioned with reference to a position just under the heating furnace and another position where the wafer transfer device of the present invention is applied.

FIG. 3 is a plan view showing how each member of the heat process system is arranged with reference to a position P1 just under the heating furnace and another position P2 where the wafer transfer device of the present invention is applied. After the wafers which have been held in the wafer boat 10 as shown in FIG. 1 are heat-processed, the wafer boat 10 is lowered to the position P1 by the lifter unit 7. It is then released from the heat insulating sleeve 6 by a swing arm 1 and carried from the position P1 to the position P2 where it is mounted on the stand 15 (see FIG. 4). The wafers which have been processed are transferred from the wafer boat 10 to a cassette 50 by the wafer transfer device of the present invention which includes a transfer mechanism 30.

On the other hand, the wafers which are not processed yet are transferred from a cassette 50 to the wafer boat 10 on the stand 15 at the position P2 by the wafer transfer device of the present invention. The wafer boat 10 is then released from the stand 5 by the swing arm 1 and carried from the position P2 to the position P1 where it is mounted on the heat insulating sleeve 6. It is loaded into the reactor tube 3, as shown in FIG. 1, by the lifter unit 7.

Figure 4:
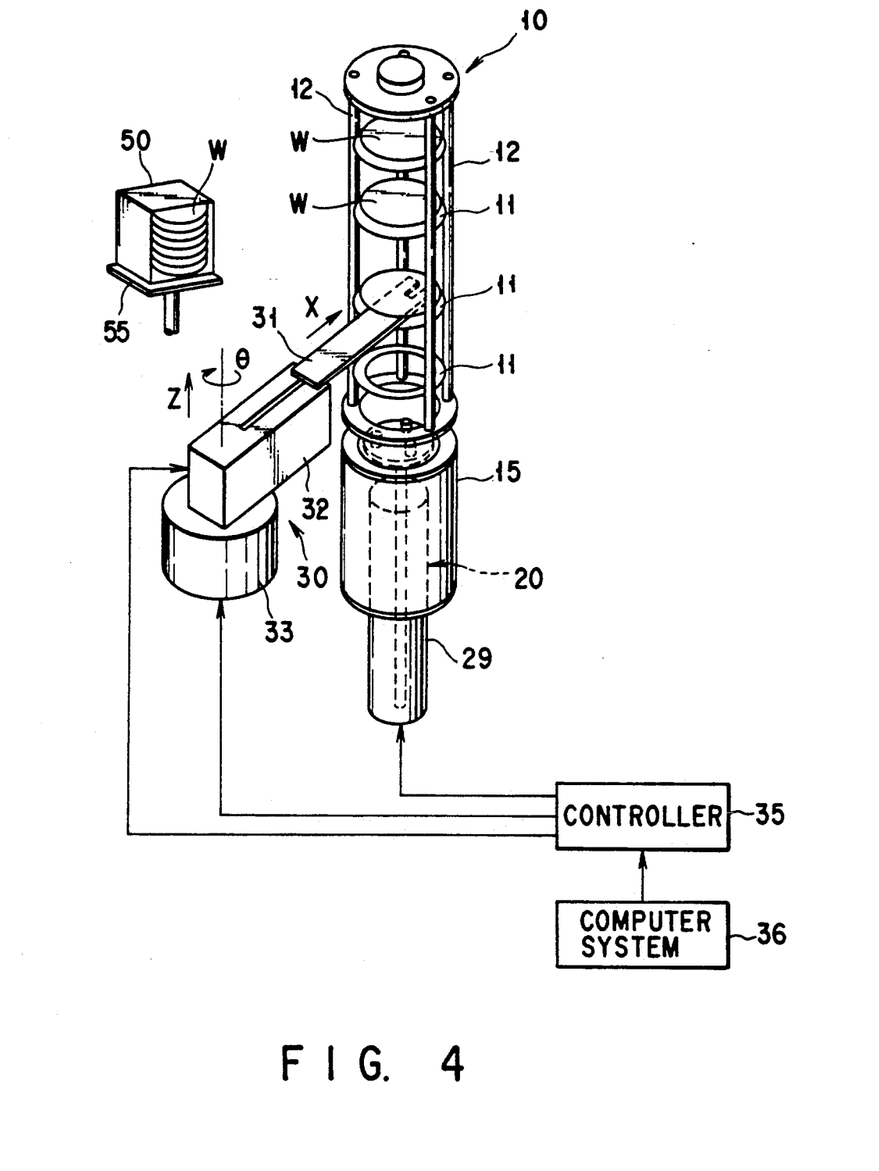
FIG. 4 is a perspective view showing the wafer transfer device according to a first embodiment of the present invention.

FIG. 4 is a perspective view schematically showing the wafer transfer device according to a first embodiment of the present invention. This wafer transfer device of the present invention includes push-up and transfer mechanisms 20 and 30 which are positioned adjacent to the wafer cassette 50. The push-up and transfer mechanisms 20 and 30 are controlled and operated by a controller 35 and a computer system 36, associating with each other.

The wafer cassette 50 is mounted on a cassette mount 55. It has plural or 25 mount levels which are arranged at the same pitch in the vertical direction and the wafers are placed on these mount levels in it.

The transfer mechanism 30 includes a transfer fork 31, a slide block 32 and a rotary base 33. The transfer fork 31 is a plate having a top surface contacted with the underside of the wafer, and it is arranged on the slide block 32 so as to slidably reciprocate in a direction X. The transfer fork 31 can be swung in a direction $\theta$ and further reciprocated in a direction Z by the rotary base 33.

Figure 5:
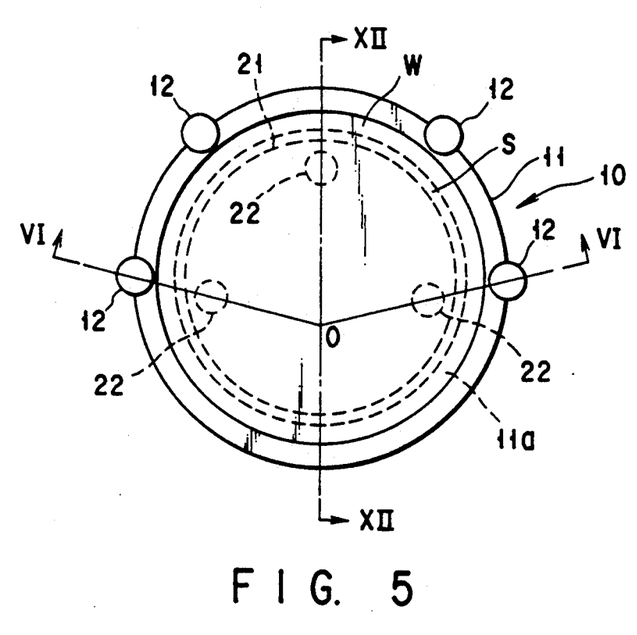
FIG. 5 shows the wafer boat mounted on a stand when viewed from the top.
Figure 6:
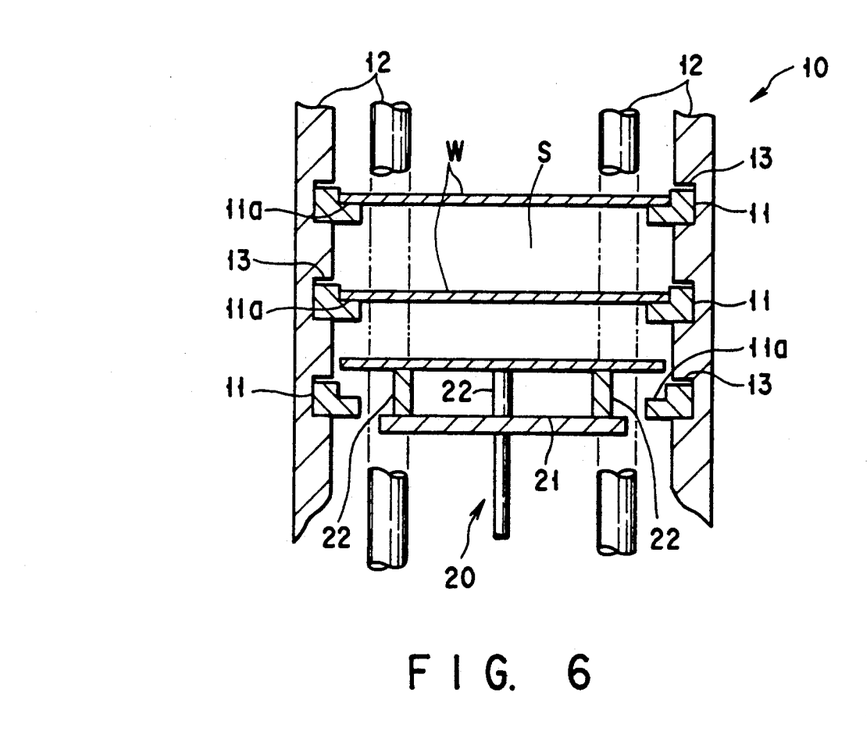
FIG. 6 is a sectional view taken along a line VI—O—VI in FIG. 5.

FIG. 5 shows the wafer boat 10 mounted on the stand 15 when viewed from the top, and FIG. 6 is a sectional view taken along a line VI—O—VI in FIG. 5.

Grooves 13 are formed on each of the columns 12 of the wafer boat 10 at regular intervals and each of the ring-shaped wafer support plates 11 is supported by the columns 12 such that it is fitted into one of the grooves 13 of the columns 12 which are at a same level. Each of the wafers is supported on the support plate 11 with its underside contacted with the wafer support face 11a.

The wafer push-up mechanism 20 includes a drive section 23 housed in the stand 15, and a push-up disk 21 movable through a space or passage which is defined by openings of the ring-shaped wafer supports 11 of the boat 10. The push-up disk 21 has three projections 22 which are contacted with the underside of the wafer to support the wafer on them.

Figure 7:
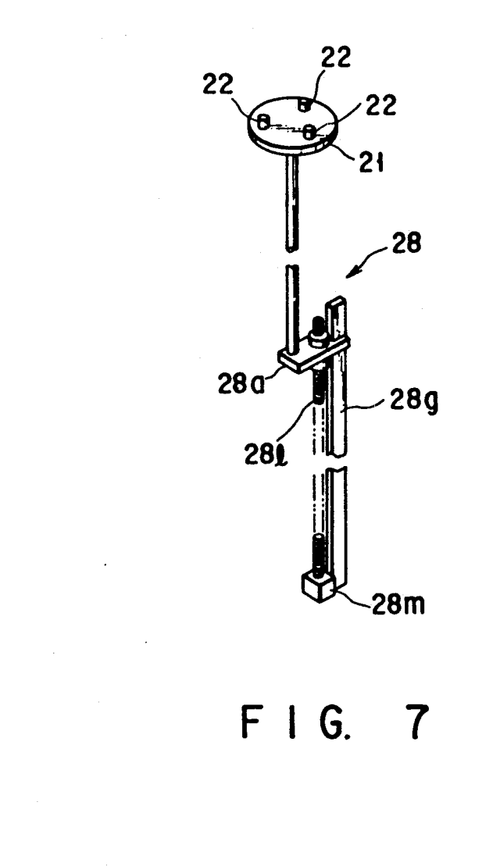
FIG. 7 is a perspective view showing in detail a drive section for a wafer push-up mechanism of the wafer transfer device according to the first embodiment.

FIG. 7 is a perspective view showing a drive section 28 for the wafer push up mechanism 20 in detail. The drive section 28 comprises a motor 28m, a screw rod 28l rotated by the motor 28m, a guide 28g, and a first lifter plate 28a connected to the wafer push-up disk 21 and provided with a ball screw mechanism. The motor 28m and the guide 28g are housed in a cylindrical cover 29 (see FIG. 4).

Figures 8A, 8B:
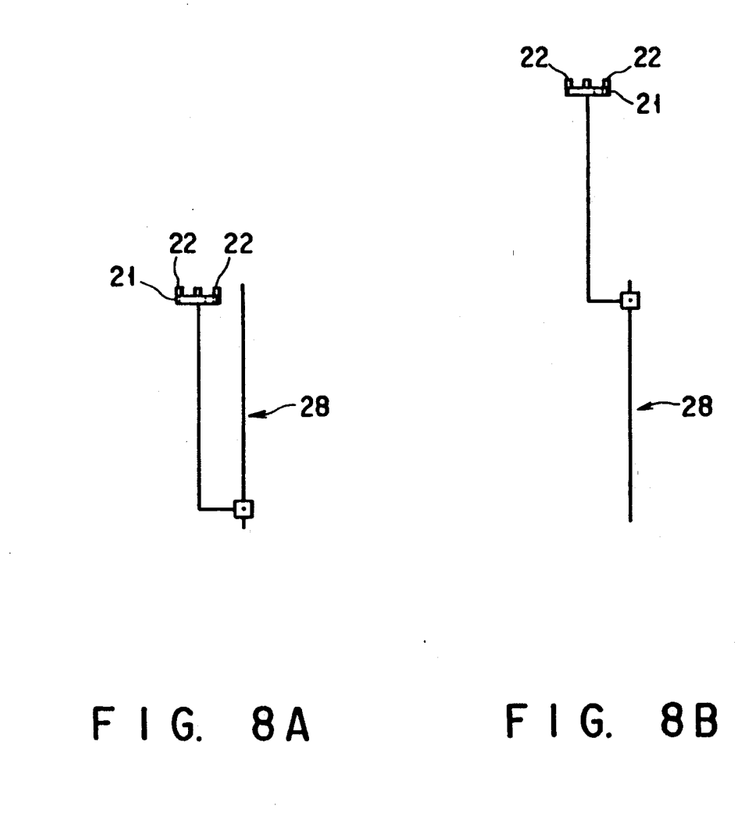
FIGS. 8A and 8B show how the wafer push-up mechanism of FIG. 7 is operated.

FIGS. 8A and 8B are intended to schematically show how the wafer push-up mechanism 20 of the first wafer transfer device is operated. As shown in FIGS. 8A and 8B, the wafer push-up disk 21 can be moved between its lower limit position (FIG. 8A) where it is waiting in the stand 15 and its upper limit position (FIG. 8B) where it is pushed up by the drive section 28.

Figure 9:
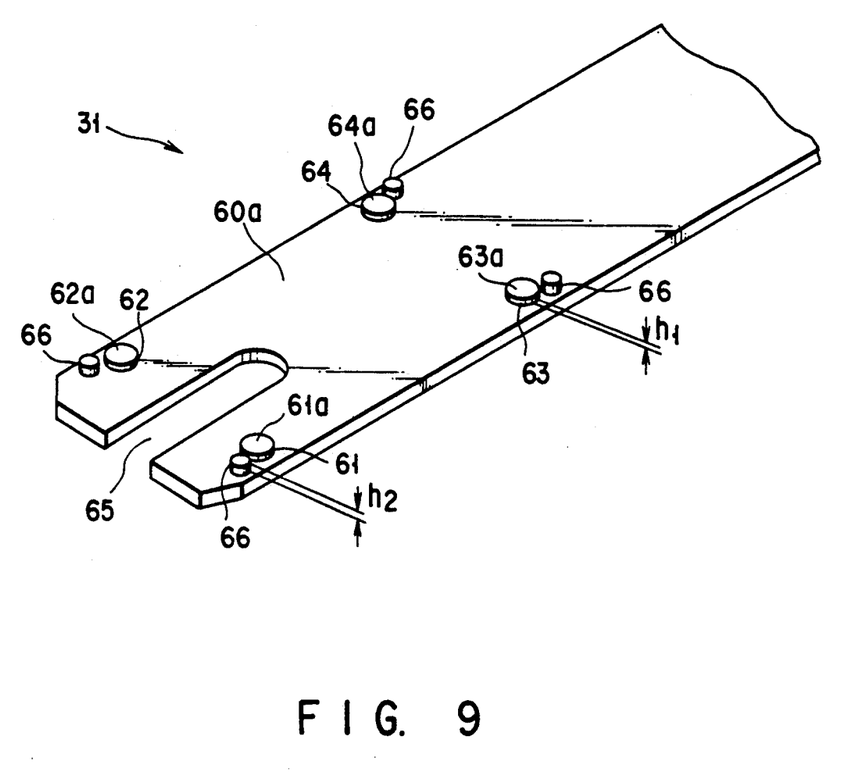
FIG. 9 is a perspective view showing a wafer transfer fork.

FIG. 9 is a perspective view showing the wafer transfer fork 31 in detail. This wafer transfer fork 31 is a plate, 210 mm long, 56 mm wide and 1.0 mm thick, made of alumina and intended to transfer 6-inch wafers.

Wafer supports 61–64 having circular tops 61a–64a are projected from the top surface 60a of a body 60 of the fork 31. When the wafer is to be transferred, the tops 61a–64a of the supports 61–64 are contacted with the underside of the wafer to support the wafer on them. Each of the tops 61a–64a of the supports 61–64 has a diameter of 10.5 mm and it also has a height $h_1$ of 0.3 mm when measured from the top 60a of the fork body 60. It is not necessarily shaped like a circle but it may be shaped like a rectangle.

Figure 10:
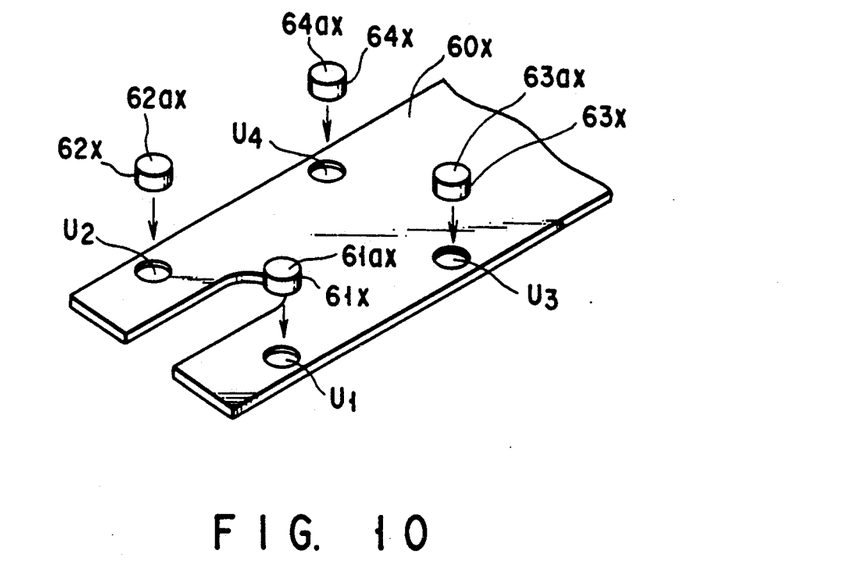
FIG. 10 is a perspective view showing an example of the manner of making the fork.
Figure 11:
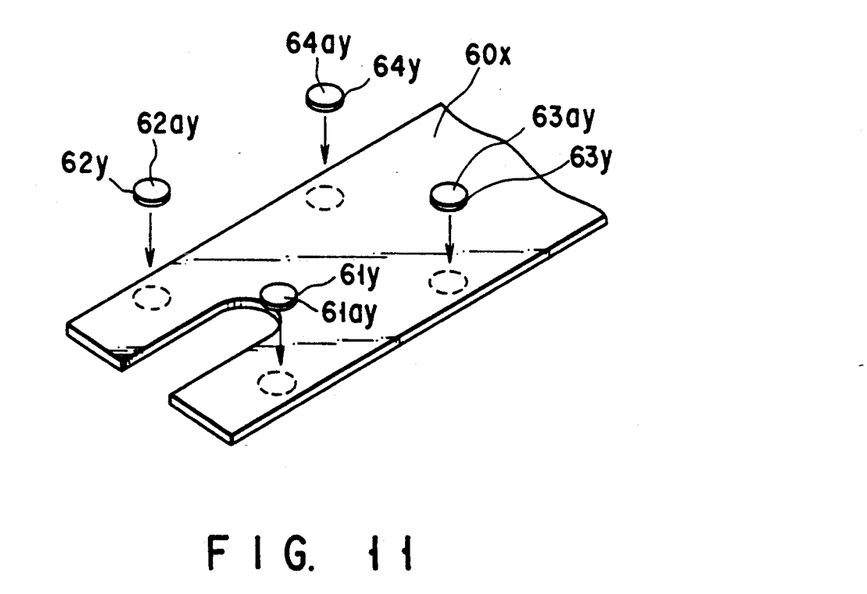
FIG. 11 is a perspective view showing another example of the manner of making the fork.

The wafer supports 61–64 are formed as follows: As shown in FIG. 10, recesses $U_1-U_4$ are formed on the top 60a of a fork body material 60x. Column-shaped wafer support material 61x–64x are press-fitted into the recesses $U_1-U_4$ and CVD coating process is then applied to these wafer support materials 61x–64x including their tops 61ax–64ax. Or, as shown in FIG. 11, wafer support materials 61y–64y having those tops 61ay–64ay to which the CVD coating process has been applied may be bonded to the top of a fork body material 60x by adhesive.

In the case of the fork 31, the CVD coating process of SiC is applied to the wafer supports 61–64 including their tops 61a–64a. A CVD coat layer which is composed of fine crystals of SiC is therefore formed on the whole surface of each of the wafer supports 61–64, thereby making their surfaces smooth like a mirror. The CVD coat layer of SiC has so high hardness that it cannot be broken by its contact with the wafer while transferring the wafer. In addition, it has extremely high purity and the amount of impurities such as heavy metal contained in it is smaller than that in quartz of which the wafer boat is made. Further, it is more advantageous particularly in that it contains extremely little of natrium which adds bad influence to the semiconductor wafer. The thickness of the CVD coat layer is about 50 μm, for example.

Reference numeral 65 in FIG. 9 denotes a cut-away portion provided at one end of the fork 31 and another reference numeral 66 represents members for preventing the wafer from being shifted from its position on the fork 31. These members are column-like projections located adjacent to their corresponding wafer supports 61–64 and having a diameter of 5 mm and a height $h_2$ of 0.7 mm when measured from the top 60a of the fork body 60. The wafer is supported at its rim portion by these stopper members 66 not to shift from its position on the fork 31 while being transferred.

According to the fork 31 of the first wafer transfer device, the wafer supports 61–64 including their tops 61a–64a which are contacted with the underside of the wafer are coated with SiC according to the CVD manner. Therefore, their surfaces can be made like a mirror, having high smoothness. In addition, their areas with which the underside of the wafer is contacted are quite small in total. This can reduce the creation of dust not to contaminate the surface of the wafer which is on the way of its being transferred.

The fork 31 may be variously modified. For example, its whole surface may be coated like a mirror according to the CVD coating process. Further, it is preferable that the CVD coat layer contains Si from the viewpoint of preventing the wafers from being contaminated. Therefore, $SiO_2$, SiN or others may be used as well.

Figure 12:
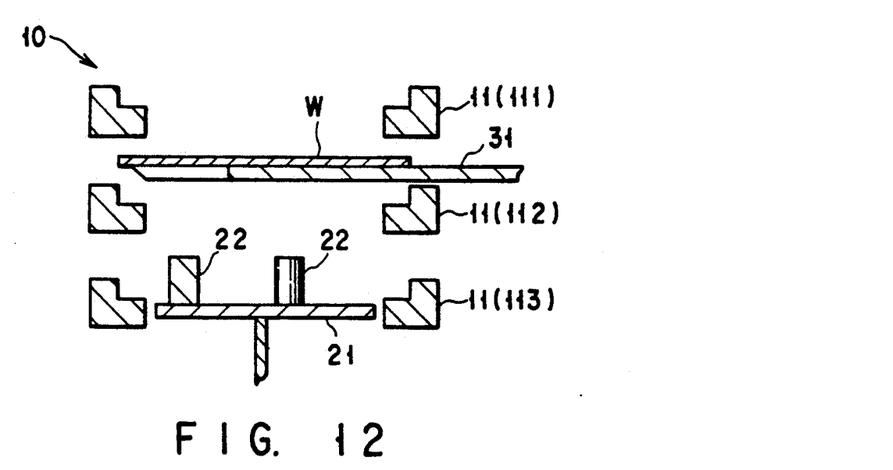
FIGS. 12 through 14 are sectional views taken along a line XII—XII in FIG. 5 and showing how the wafer is transferred into the wafer boat.
Figure 13:
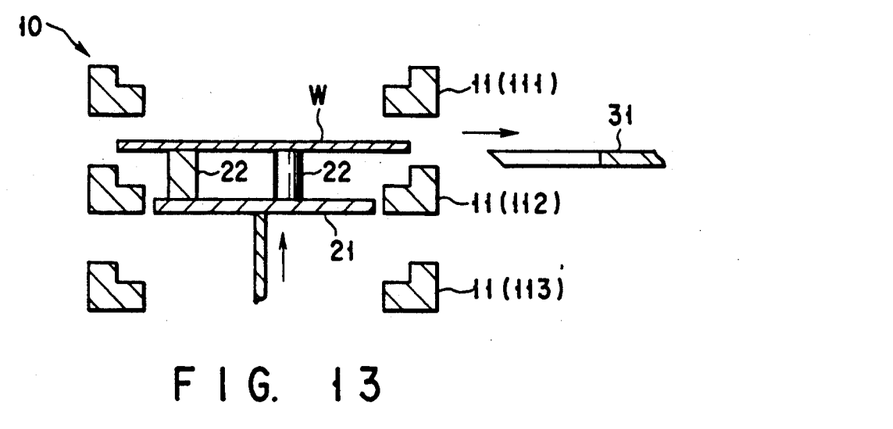
Figure 14:
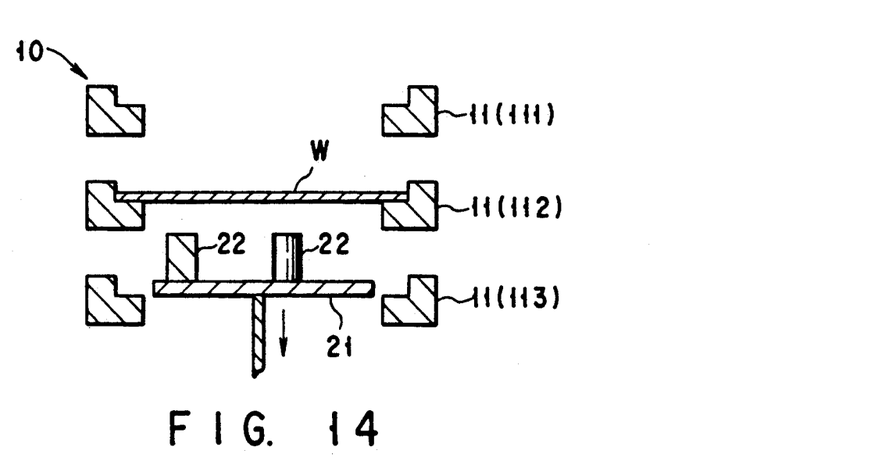

An example of the process of transferring the wafers from the wafer cassette 50 to the boat 10 will be described with reference to FIG. 4 and FIGS. 12 through 15. FIGS. 12 through 14 are sectional views taken along a line XII—XII in FIG. 5 and some of components are omitted for the sake of simplicity in them.

1. The slide block 32 is set to oppose the fork 31 to the cassette 50. The fork 31 is then moved in the direction X or toward the cassette 50 and positioned under the wafer W.

2. The slide block 32 is lifted to move the fork 31 in the direction Z. The tops 61a–64a of the wafer supports 61–64 on the fork 31 are thus contacted with the underside of the wafer W to support the wafer W on them or on the fork 31.

3. The fork 31 is retreated in a direction reverse to the direction X to take the wafer W out of the cassette 50.

4. The slide block 32 is swung in the direction θ to oppose the fork 31 to the boat 10.

5. The fork 31 on which the wafer W is supported is inserted between the support plates 11 (or 111) and 11 (or 112) of the boat 10, as shown in FIG. 12.

Figure 15:
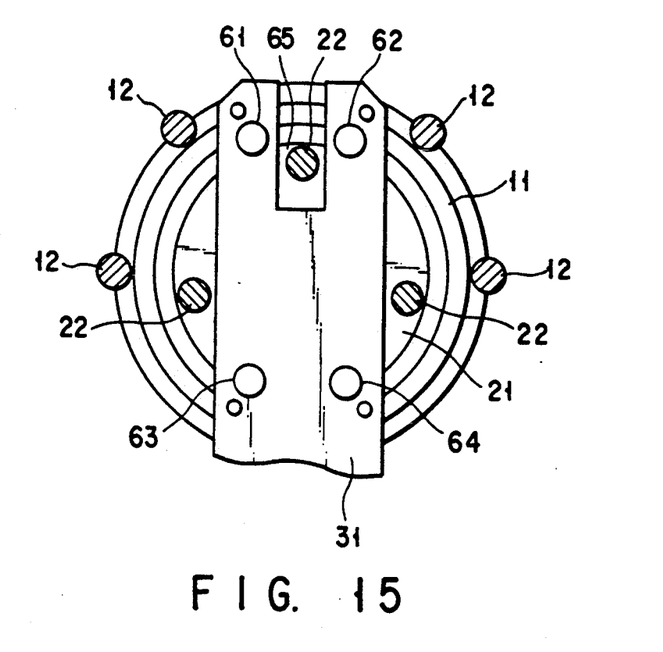
FIG. 15 is a sectional view showing how the fork is related to a push-up disk.

6. The push-up disk 21 of the push-up mechanism 20 is lifted until the wafer W can be held on the projections 22 of the disk 21. The wafer W is thus supported on the tops of the projections 22 while the tops 61a–64a of the wafer supports 61–64 on the fork 31 are separated from the underside of the wafer W. FIG. 15 shows this state wherein the boat 10 is sectioned along a plane parallel to the face of the wafer W. As shown in FIG. 15, the projections 22 on the disk 21 are projected above the fork 31 through the cut-away portion 65 and on both sides of the fork 31 without contacting it.

7. The fork 31 is retreated from the boat 10 in the direction reverse to the direction X. Only the push-up disk 31 is thus left in the opening of the ring-shaped support plate 11, as shown in FIG. 13.

8. The push-up disk 21 is lowered. The wafer W is thus supported on the support plate 11 (or 112), as shown in FIG. 14.

When the above procedure is repeated relative to every wafer on the support plate 11 of the boat, the wafers can be transferred from the cassette 50 to the boat 10.

When the above procedure is reversely repeated, the wafers which have been processed can be transferred from the boat 10 to the cassette 50. In short, the wafer on the support plate 11 is pushed up by the push-up mechanism 20 to release the underside of the wafer from the support plate 11 and the fork 31 is inserted into a gap between the wafer and the support plate 11 to support the wafer on the tops 61a–64a of the wafer supports 61–64 thereof. The wafer thus supported on the fork 31 is then taken out of the boat 10.

According to the wafer transfer device of the present invention, the underside of the wafer is separated from the support plate 11 of the boat 10 by the push-up mechanism 20. The gap into which the fork 31 is inserted can be thus provided between the underside of the wafer and the support plate 11.

Further, the push-up mechanism 20 is arranged to move up an down through the space or passage S which is defined by the openings of the plural ring-shaped wafer support plates 11. This makes it unnecessary to make large the intervals between the support plates 11 of the boat 10. In other words, the intervals can be kept smaller to thereby enable a larger number of the wafers to be processed every batch process without making the boat 10 large-sized.

The following test was conducted to study the effect of the CVD coat layer applied to the fork 31.

Figure 16:
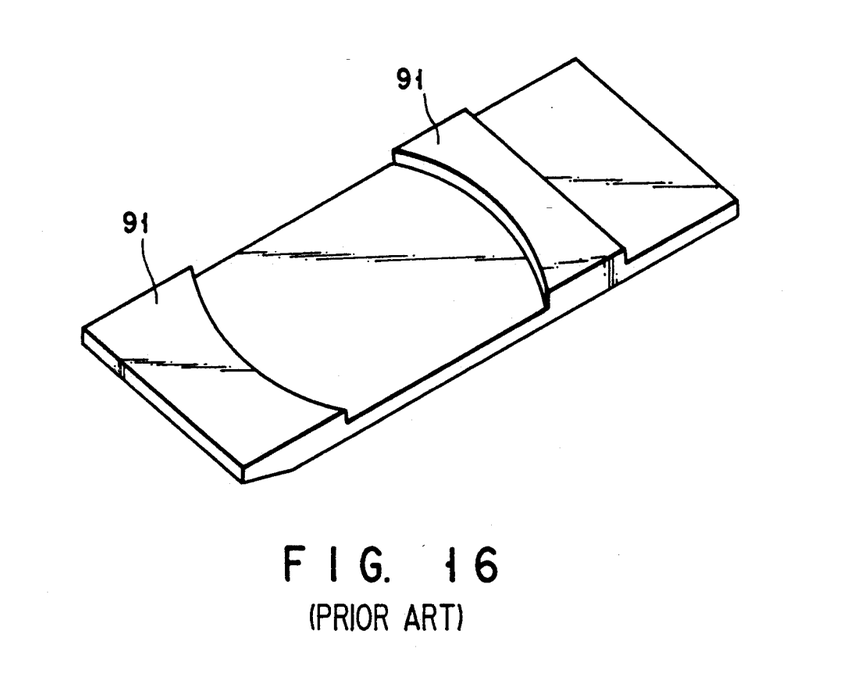
FIG. 16 is a perspective view showing the conventional fork which is used as a comparison example.

The transferring of wafers was carried out by the wafer transfer device provided with the fork 31 and the number of particles stuck to the surface of each of the wafers thus transferred was measured. For comparison, same measurement was made about those wafers which had been transferred by the wafer transfer device provided with an alumina fork (material: $Al_2O_3$ (A479-SS) made by Kyosera Corp.). This alumina fork was shaped, as shown in FIG. 16, having wafer support faces 91.

The transferring of wafers and the measuring of the number of particles stuck were carried out in a clean room (the class of cleanness: 10). The number of particles stuck was measured by Surfscan 5500 (made by Tencor Instruments). The target of this Surfscan 5500 was those particles which were larger than 0.2 μm.

The slide block 32 was reciprocated in directions X and Z without being swung in the direction θ to thereby transfer the wafers into and out of the cassette 50. The stroke and the speed of the slide block 32 driven in the direction X were 240 mm and 30 mm/sec.. Those in the direction Z were 4 mm and 4 mm/sec..

One cycle comprised exchanging the wafer with a new one, measuring the number of particles adhering to the new wafer, transferring the new wafer into and out of the cassette 50, and measuring the number of particles stuck to the wafer thus transferred. Average values were obtained after 500 and 5000 cycles. Results thus obtained were as shown in Table 1.

TABLE 1

| | Area of wafer Contacted (mm²) | Number of Particles Stuck | |
|---|---|---|---|
| | | 500 Cycles | 5000 Cycles |
| Our Fork | 78.5 | 15.4 | 16.8 |
| Fork of FIG. 16 | 602.5 | 28.4 | 19.9 |

As shown in Table 1, the number of particles stuck because of dust created was smaller in the case of the fork of the present invention than in the case of the conventional fork.

Figure 17:
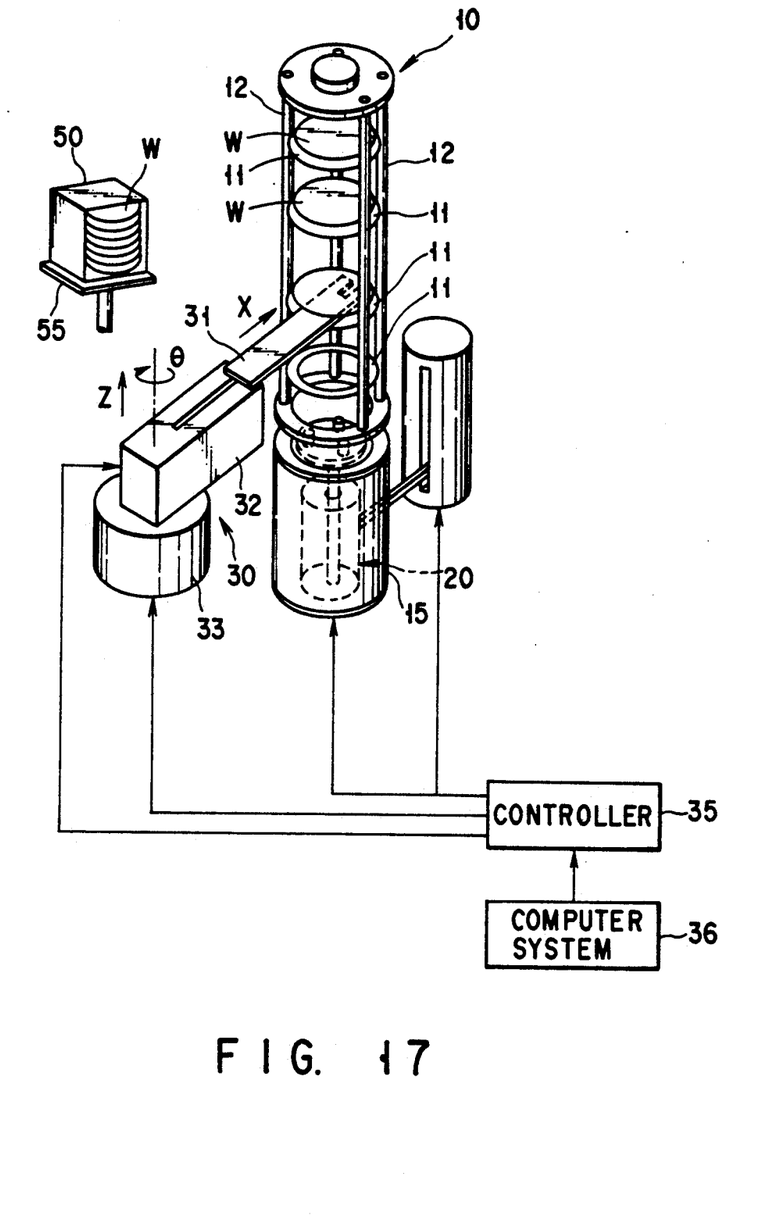
FIG. 17 is a perspective view showing the wafer transfer device according to a second embodiment of the present invention.
Figure 18:
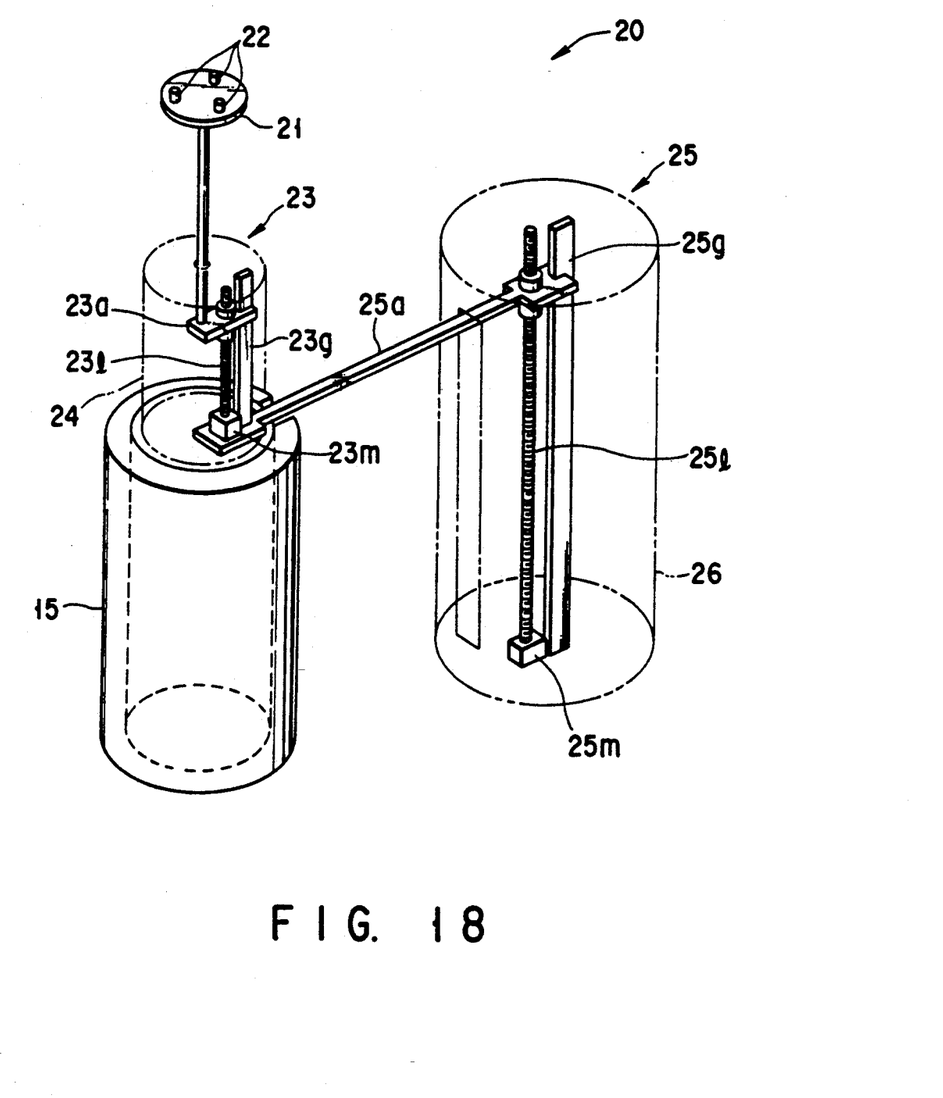
FIG. 18 is a perspective view showing in detail a drive section for a wafer push-up mechanism of the wafer transfer device according to the second embodiment.

FIG. 17 is a perspective view schematically showing the wafer transfer device according to a second embodiment of the present invention. FIG. 18 is a perspective view schematically showing a drive section for a push-up mechanism of this wafer transfer device. Same components as those of the first wafer transfer device shown in FIG. 4 will be denoted by same reference numerals and description on these components will be omitted.

The second wafer transfer device is different from the first one in that the drive section for the push-up mechanism 20 is of 2-stage type comprising first and second lifter means 23 and 25.

The first lifter means 23 comprises a motor 23m, screw rod 23l rotated by the motor 23m, a guide 23g, and a first lifter plate 23a connected to the push-up disk 21 and provided with the ball screw mechanism. The motor 23m and the guide 23g are housed in a cylindrical cover 24 and fixed to one end of a second lifter plate 25a which will be described later. When the screw rod 23l is rotated, the first lifter plate 23a is moved along the guide 23g to thereby move the wafer push-up disk 21 up and down in relation to the second lifter plate 25a.

The second lifter means 25 comprises a motor 25m, screw rod 25l rotated by the motor 25m, a guide 25g, and the second lifter plate 25a having the ball screw mechanism, which are housed in a cylindrical cover 26. The cylindrical cover 26 and the stand 15 have slits through which the second lifter plate 25a is moved up and down. When the screw rod 25l is rotated, the second lifter plate 25a is moved along the guide 25g to move the first lifter means 23 up and down.

Figure 19A:
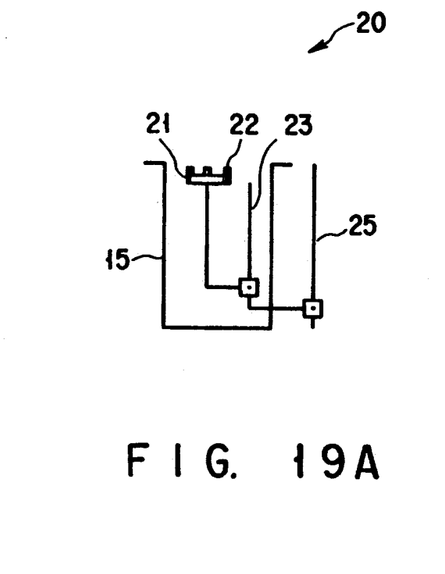
FIGS. 19A through 19C schematically showing how the wafer push-up mechanism of FIG. 18 is operated.
Figure 19B:
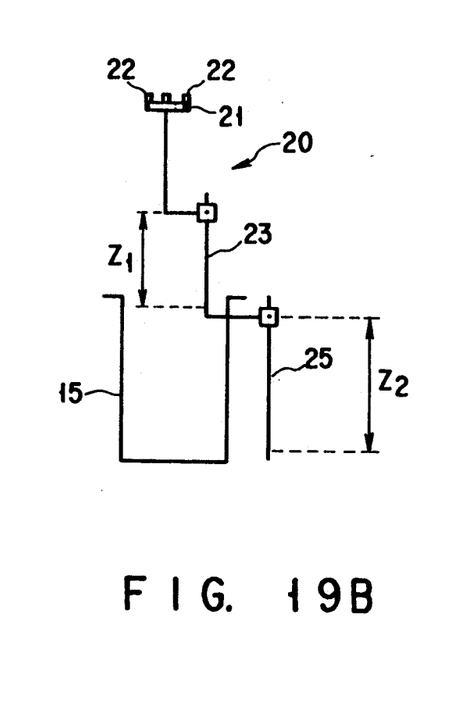
Figure 19C:
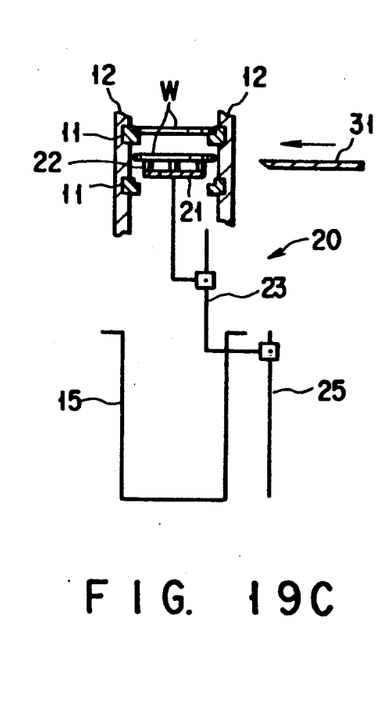

FIGS. 19A through 19C are intended to show how the push-up mechanism 20 of the second wafer transfer device is operated.

FIG. 19A shows the push-up disk 21 waiting in the boat mounted stand 15 or kept at its lower limit level. FIG. 19B shows the push-up disk 21 lifted to its upper limit level by the first and second lifter means 23 an 25. FIG. 19C shows the wafer W pushed up by the push-up mechanism 20.

In FIG. 19B, $Z_1$ denotes the stroke of the lifter plate 23a in the case of the first lifter means 23 and $Z_2$ the stroke of the lifter plate 25a in the case of the second lifter means 25. The sum $(Z_1+Z_2)$ is equal to the stroke of the lifter plate 28a driven by the drive section 28 in the wafer transfer device according to the first embodiment and shown in FIGS. 4, 8A and 8B. In short, the push-up mechanism of the second wafer transfer device is driven by the drive section of the 2-stage type. Therefore, the space the second push-up mechanism occupies can be made smaller. This is a merit in addition to those achieved by the first wafer transfer device.

When the stroke of the lifter plate driven by the drive section of the push-up mechanism is long, the wafer transfer device and the heat process system of the vertical type provided with this wafer transfer device are disadvantageous on the basis of a limit in height upon their being transported and carried into a clean room. This may make it impossible to provide the space the push-up mechanism occupies. Particularly when the wafers are to be transferred into and out of the high wafer boat of the vertical type, it is quite difficult to provide the vertically-extending space the push-up mechanism occupies.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A wafer transfer device for transferring wafers into and out of a wafer boat in which a plurality of wafer support plates are vertically arranged having intervals between them, said wafer support plates being ring-shaped and defining a vertically-extending passage by center openings thereof, said wafer transfer device comprising:

carrying means for horizontally carrying the wafer into and out of the wafer boat between the wafer support plates;

a wafer push-up disk arranged movable up and down through the passage;

wafer support means projected from a top of the push-up disk and arranged contactable with an underside of the wafer without interfering with the carrying means;

an extension member extending down through the passage with a lower end beyond a lowermost one of the wafer support plates, and supporting at an upper end the wafer push-up disk;

drive means engaging with the lower end of the extension member for driving the push-up disk up and down via the extension member, such that the push-up disk moves without department from the passage between a lower position where a top of the wafer support means is located under the lowermost one of the wafer support plates and an upper position where the top of the wafer support means is located above an uppermost one of the wafer support plates; and means for controlling the carrying means and the push-up disk such that they can be associated with each other.

2. The device according to claim 1, wherein said carrying means include a fork having a wafer-mounted face, and means for horizontally moving the fork into and out of the boat between the wafer support plates.

3. The device according to claim 2, wherein said carrying means include means for vertically moving the fork up and down.

4. The device according to claim 1, wherein said wafer supports on the push-up disk are three projections projected from the top of the push-up disk.

5. The device according to claim 1, wherein said drive means for the push-up disk include first lifter means connected directly to the extension member and second lifter means for moving the first lifter means up and down.

6. The device according to claim 2, wherein plural projections each having a top with which the underside of the wafer is contacted are projected from the wafer-mounted face of said fork and the tops of said projections are coated by a CVD coating layer of material containing Si therein.

7. The device according to claim 4, wherein said fork has cut-away portion and one of the projections on the push-up disk is passed through the cut-away portion of the fork when the push-up disk encounters the fork, 8. A wafer transfer device for transferring wafers between a wafer boat in which a plurality of wafer support plates are vertically arranged having intervals between them and a wafer cassette in which a plurality of wafer-mounted levels are vertically arranged having intervals between them, said wafer support plates being ring-shaped and defining a vertically-extending passage by center openings thereof, said wafer transfer device comprising:

carrying means for horizontally carrying the wafer into and out of the wafer boat between the wafer support plates and also into and out of the wafer cassette between the wafer-mounted levels;

positioning means for moving the carrying means between a first position where the carrying means is opposed to the wafer boat and a second position where it is opposed to the wafer cassette;

a wafer push-up disk arranged movable up and down through the passage;

wafer support means projected from a top of the push-up disk and arranged contactable with an underside of the wafer without interfering with the carrying means;

an extension member extending down through the passage with a lower end beyond a lowermost one of the wafer support plates and supporting at an upper end the wafer push-up disk;

drive means engaging with the lower end of the extension member for driving the push-up disk up and down via the extension member, such that the push-up disk moves without departing from the passage between a lower position where a top of the wafer support means is located under the lowermost one of the wafer support plates and an upper position where the top of the wafer support means is located above an uppermost one of the wafer support plates; and means for controlling the carrying means and the push-up disk such that they can be associated with each other.

9. The device according to claim 8, wherein said carrying means include a fork having a wafer-mounted face, and means for horizontally moving the fork into and out of the boat between the wafer support plates.

10. The device according to claim 9, wherein said carrying means include means for vertically driving the fork.

11. The device according to claim 8, wherein said positioning means include means for swinging the carrying means.

12. The device according to claim 8, wherein said wafer support means on the push-up disk are three projections projected from the top of said push-up disk.

13. The device according to claim 8, wherein said drive means for the push-up disk include first lifter means connected directly to the extension member and second lifter means for moving the first lifter means up and down.

14. The device according to claim 9, wherein plural projections each having a top contactable with the underside of the wafer are projected from the wafer-mounted face of the fork and the tops of the projections on the fork are coated by a CVD coating layer of material containing Si therein.

15. The device according to claim 12, wherein said fork has a cut-away portion and one of said projections on the push-up disk is passed through the cut-away portion of said fork when the push-up disk encounters the fork.

* * * * *